United States Patent
Chen et al.

(10) Patent No.: US 9,331,016 B2
(45) Date of Patent: May 3, 2016

(54) SOC DESIGN WITH CRITICAL TECHNOLOGY PITCH ALIGNMENT

(71) Applicant: QUALCOMM Incorporated, San Diego, CA (US)

(72) Inventors: Xiangdong Chen, San Diego, CA (US); Ohsang Kwon, San Diego, CA (US); Esin Terzioglu, San Diego, CA (US); Hadi Bunnalim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/338,229

(22) Filed: Jul. 22, 2014

(65) Prior Publication Data
US 2015/0028495 A1    Jan. 29, 2015

Related U.S. Application Data

(60) Provisional application No. 61/858,567, filed on Jul. 25, 2013.

(51) Int. Cl.
*H01L 29/40* (2006.01)
*H01L 23/522* (2006.01)
*H01L 27/02* (2006.01)
*H01L 23/528* (2006.01)

(52) U.S. Cl.
CPC .......... *H01L 23/5226* (2013.01); *H01L 23/528* (2013.01); *H01L 27/0207* (2013.01); *H01L 2924/0002* (2013.01)

(58) Field of Classification Search
CPC .................. H01L 21/76813; H01L 21/76816; H01L 23/498; H01L 23/5226; H01L 23/528; H01L 27/0207

USPC ............ 257/774, 48, 506, 758, 368; 438/675; 716/115, 129

See application file for complete search history.

(56) References Cited

U.S. PATENT DOCUMENTS

| | | | |
|---|---|---|---|
| 5,471,093 A | 11/1995 | Cheung | |
| 5,508,938 A | 4/1996 | Wheeler | |
| 7,398,498 B2 * | 7/2008 | Teig ................. | G06F 17/5077 716/129 |
| 7,492,013 B2 | 2/2009 | Correale, Jr. et al. | |
| 7,847,588 B2 | 12/2010 | Bertin | |
| 8,174,868 B2 | 5/2012 | Liaw | |
| 8,686,567 B2 | 4/2014 | Endo et al. | |
| 8,863,048 B1 * | 10/2014 | Gerousis ............ | G06F 17/5072 716/100 |

(Continued)

OTHER PUBLICATIONS

International Search Report and Written Opinion—PCT/US2014/047834—ISA/EPO—Nov. 12, 2014.

(Continued)

*Primary Examiner* — Mohammed Shamsuzzaman
(74) *Attorney, Agent, or Firm* — Arent Fox LLP

(57) ABSTRACT

An SOC apparatus includes a plurality of gate interconnects with a minimum pitch g, a plurality of metal interconnects with a minimum pitch m, and a plurality of vias interconnecting the gate interconnects and the metal interconnects. The vias have a minimum pitch v. The values m, g, and v are such that $g^2+m^2 \geq v^2$ and an LCM of g and m is less than 20 g. The SOC apparatus may further include a second plurality of metal interconnects with a minimum pitch of $m_2$, where $m_2 > m$ and the LCM of g, m, and $m_2$ is less than 20 g.

15 Claims, 5 Drawing Sheets

(56) References Cited

U.S. PATENT DOCUMENTS

| | | | |
|---|---|---|---|
| 2003/0051217 A1* | 3/2003 | Cheng | G06F 17/5077 716/115 |
| 2004/0068710 A1 | 4/2004 | Miyakawa | |
| 2006/0289861 A1* | 12/2006 | Correale | H01L 27/11807 257/48 |
| 2006/0289994 A1* | 12/2006 | Greenberg | H01L 23/528 257/758 |
| 2008/0061441 A1 | 3/2008 | Liu | |
| 2008/0315348 A1* | 12/2008 | Xu | H01L 23/522 257/506 |
| 2010/0006951 A1 | 1/2010 | Becker et al. | |
| 2013/0072020 A1* | 3/2013 | Blatchford | H01L 21/76813 438/675 |
| 2013/0175631 A1* | 7/2013 | Behrends | H01L 21/28123 257/368 |

OTHER PUBLICATIONS

International Preliminary Report on Patentability—PCT/US2014/047834 The International Bureau of WIPO—Geneva, Switzerland, Oct. 29, 2015.

* cited by examiner

| | 28nm | 20/16/14nm |
|---|---|---|
| Gate | g₁ (e.g., 130nm) | g₂ (e.g., 90nm (70%)) |
| M1 | m1₁ (e.g., 90nm) | m1₂ (e.g., 64nm (70%)) |
| Ma | ma₁ (e.g., 90nm) | ma₂ (e.g., 64nm (70%)) |
| Mb | | mb (e.g., 80nm) |
| Via | v1 (e.g., 130nm) | v2 (e.g., 115nm (88%)) |

SOC DESIGN WITH CRITICAL TECHNOLOGY PITCH ALIGNMENT

CROSS-REFERENCE TO RELATED APPLICATION(S)

This application claims the benefit of U.S. Provisional Application Ser. No. 61/858,567, entitled "A SOC DESIGN WITH CRITICAL TECHNOLOGY PITCH ALIGNMENT" and filed on Jul. 25, 2013, which is expressly incorporated by reference herein in its entirety.

BACKGROUND

1. Field

The present disclosure relates generally to a circuit layout, and more particularly, to a system on a chip (SOC) design with critical technology pitch alignment.

2. Background

A pitch is the distance between the same type of adjacent elements. To achieve cost, power, and performance benefits of scaling a pitch by x %, an area scaling of approximately $x^2$% should be obtained. For example, to achieve the full cost, power, and performance benefits of a 70% pitch scaling, approximately a 50% area scaling should be obtained. However, given a requirement to obtain an $x^2$% area scaling, an x % pitch scaling may not provide the best cost, power, and performance benefits. As such, methods and apparatuses are needed for determining a pitch or pitch scaling given a desired area scaling.

SUMMARY

In an aspect of the disclosure, a method and an apparatus are provided. An SOC apparatus includes a plurality of gate interconnects with a minimum pitch g, a plurality of metal interconnects with a minimum pitch m, and a plurality of vias interconnecting the gate interconnects and the metal interconnects. The vias have a minimum pitch v. The values m, g, and v are such that $g^2+m^2 \geq v^2$ and an LCM of g and m is less than 20 g.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
FIG. 1 is a diagram illustrating pitch scalings.

FIG. 1 is a diagram 100 illustrating pitch scalings. As shown in FIG. 1, in a 28 nm manufacturing process technology, the gate interconnect (may also be referred to as "POLY" interconnect) may have a minimum pitch of $g_1$ (the distance between any two gate interconnects is at the minimum $g_1$). Upon scaling in a 20 nm, 16 nm, 14 nm, and/or other manufacturing process technology, the gate interconnect may have a minimum pitch of $g_2$ (the distance between any two gate interconnects is at the minimum $g_2$). In one example, $g_1$ may be 130 nm. A 70% scaling of the gate interconnect pitch would result in a $g_2$ of 90 nm. In a 28 nm manufacturing process technology, the first metal layer M1 may have a minimum pitch of $m1_1$ (the distance between any two first metal layer M1 interconnects is at the minimum $m1_1$). Upon scaling in a 20 nm, 16 nm, 14 nm, and/or other manufacturing process technology, the first metal layer M1 may have a minimum pitch of $m1_2$ (the distance between any two first metal layer M1 interconnects is at the minimum $m1_2$). In one example, $m1_1$ may be 90 nm. A 70% scaling of the first metal layer M1 interconnect pitch would result in an $m1_2$ of 64 nm. In a 28 nm manufacturing process technology, other metal layers Ma (e.g., M2, M3, M4, M5) may have a minimum pitch of $ma_1$ (the distance between any two metal layer Ma interconnects is at the minimum $ma_1$). Upon scaling in a 20 nm, 16 nm, 14 nm, and/or other manufacturing process technology, the metal layer Ma may have a minimum pitch of $ma_2$ (the distance between any two metal layer Ma interconnects is at the minimum $ma_2$). In one example, $ma_1$ may be 90 nm. A 70% scaling of the metal layer Ma interconnect pitch would result in an $ma_2$ of 64 nm. In the 20 nm, 16 nm, 14 nm, and/or other manufacturing process technology, the Mb metal layer may have a pitch of mb. The Mb metal layer is higher than the Ma metal layer and may be wider than the Ma metal layer. For example, the Ma metal layer may include an M2 metal layer and an M3 metal layer, and the Mb metal layer may include an M4 metal layer. For another example, the Ma metal layer may include an M2 metal layer, an M3 metal layer, and an M4 metal layer, and the Mb metal layer may include an M5 metal layer. In one example, mb is 80 nm. In a 28 nm manufacturing process technology, vias may have a minimum pitch of $v_1$ (the distance between any two vias is at the minimum $v_1$). Upon scaling in a 20 nm, 16 nm, 14 nm, and/or other manufacturing process technology, the vias may have a minimum pitch of $v_2$ (the distance between any two vias is at the minimum $v_2$). In one example, $v_1$ may be 130 nm. Maintaining a process limit due to a single patterning process (using only one mask rather than multiple masks in a double patterning process) limits the minimum pitch of any two vias. Assuming a 115 nm minimum pitch (i.e., assuming $v_2$ is 115 nm) results in an 88% scaling of the vias. In this example, the via pitch is not necessarily scaled similar to other elements, such as the gate and metal interconnects.

In the aforementioned example of FIG. 1, given an 88% pitch scaling limit for the vias, scaling all of the other metal layers by 70% is not ideal because the interconnects and vias are not aligned. As discussed supra, to achieve cost, power, and performance benefits of scaling a pitch by x %, an area scaling of approximately $x^2$% should be obtained. For example, to achieve the full cost, power, and performance benefits of a 70% pitch scaling, approximately a 50% area scaling should be obtained. However, as discussed further in relation to FIG. 2, given a requirement to obtain an $x^2$% area scaling, an x % pitch scaling may not provide the best cost, power, and performance benefits when limiting the via pitch scaling.

Figure 2:
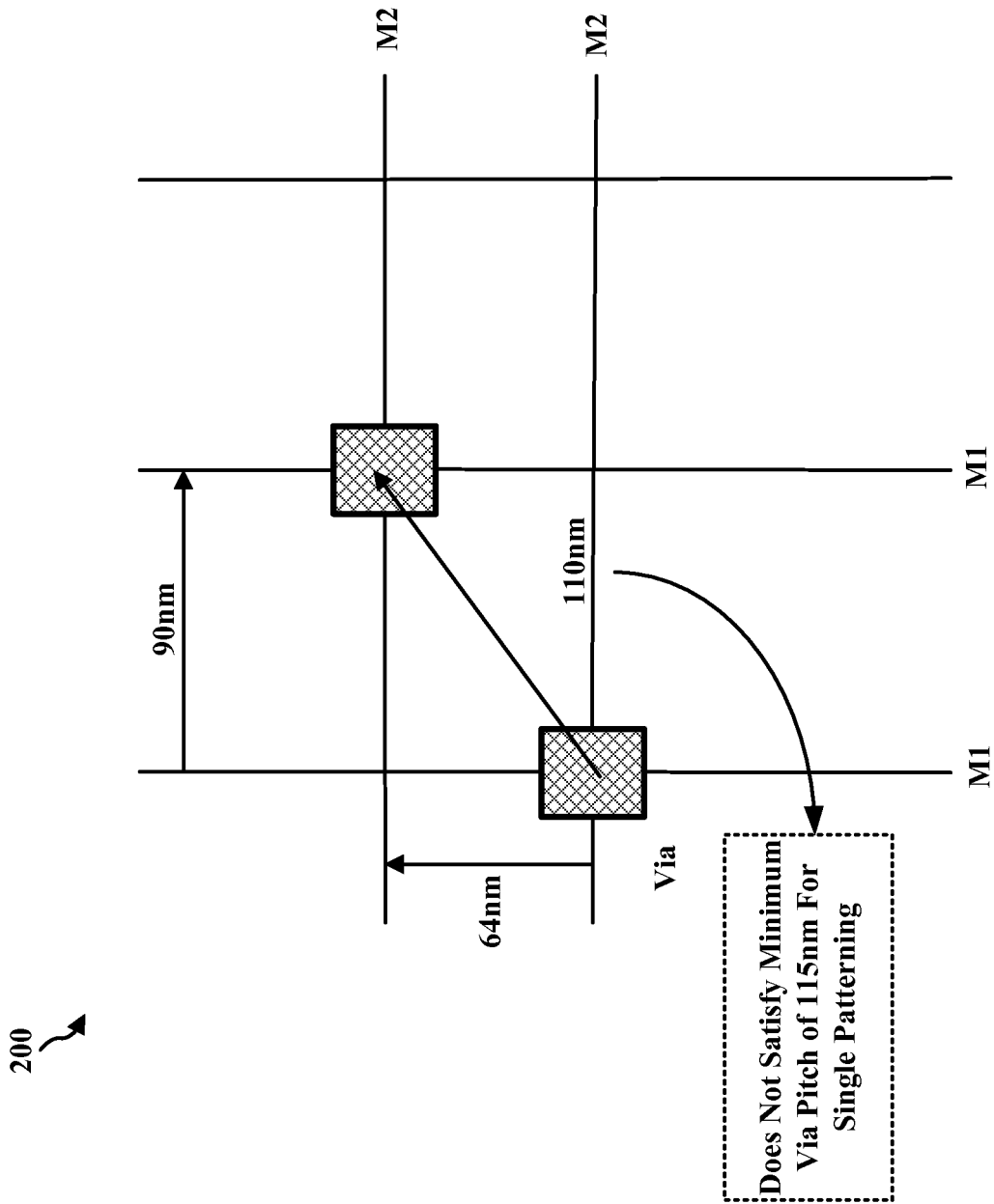
FIG. 2 is a diagram illustrating gate interconnect, metal interconnect, and via pitches.

FIG. 2 is a diagram 200 illustrating gate interconnect, metal interconnect, and via pitches. In FIG. 2, the two shown metal layer M1 interconnects extend in the same direction as the gate interconnects, are connected to the gate interconnects, and have the same pitch as the gate interconnects. Other metal layer M1 interconnects may have a smaller pitch, such as 64 nm. Accordingly, as shown in FIG. 2, when the gate interconnect pitch $g_2$ is a minimum 90 nm and the metal layer M2 pitch $ma_2$ is a minimum 64 nm, the via pitch $v_2$ is 110 nm. If the process limit for single patterning is 115 nm for the via pitch, a via pitch of 110 nm would not satisfy the minimum via pitch requirements for single patterning. Assuming a via pitch of 115 nm and a 70% pitch scaling for the gate interconnect and the metal layer M2, the gate interconnect, vias, and metal interconnect pitches would not align, which can cause pin access difficulty, degrade place and route efficiency, and cause a low place and route utilization (the area utilized may not be reduced to 50%). In one configuration, the scaling of the gate interconnect pitch $g_2$ and/or the metal layer M2 interconnect pitch $ma_2$ may be increased in order to satisfy the requisite scaling of the via pitch $v_2$, and allow for improved pin access, place and route efficiency, and place and route utilization.

Figure 3:
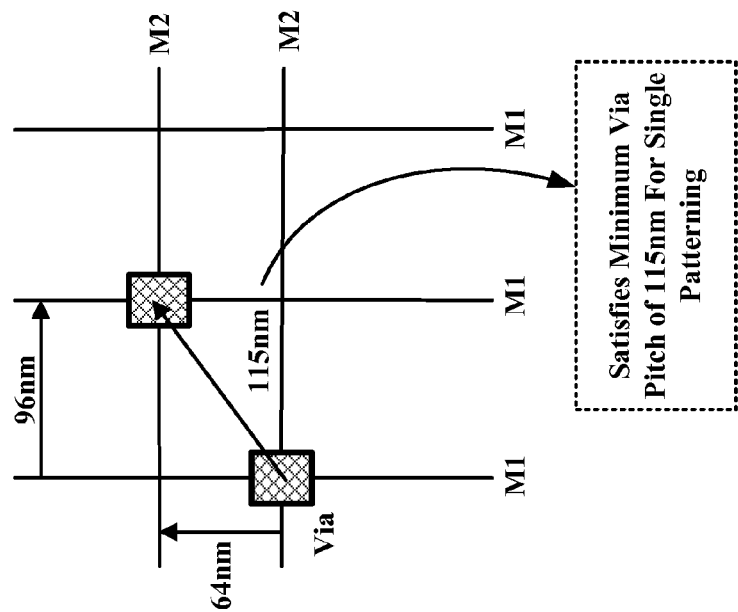
FIG. 3 is a diagram illustrating a first set of exemplary gate interconnect, metal interconnect, and via pitches.
Figure 3:
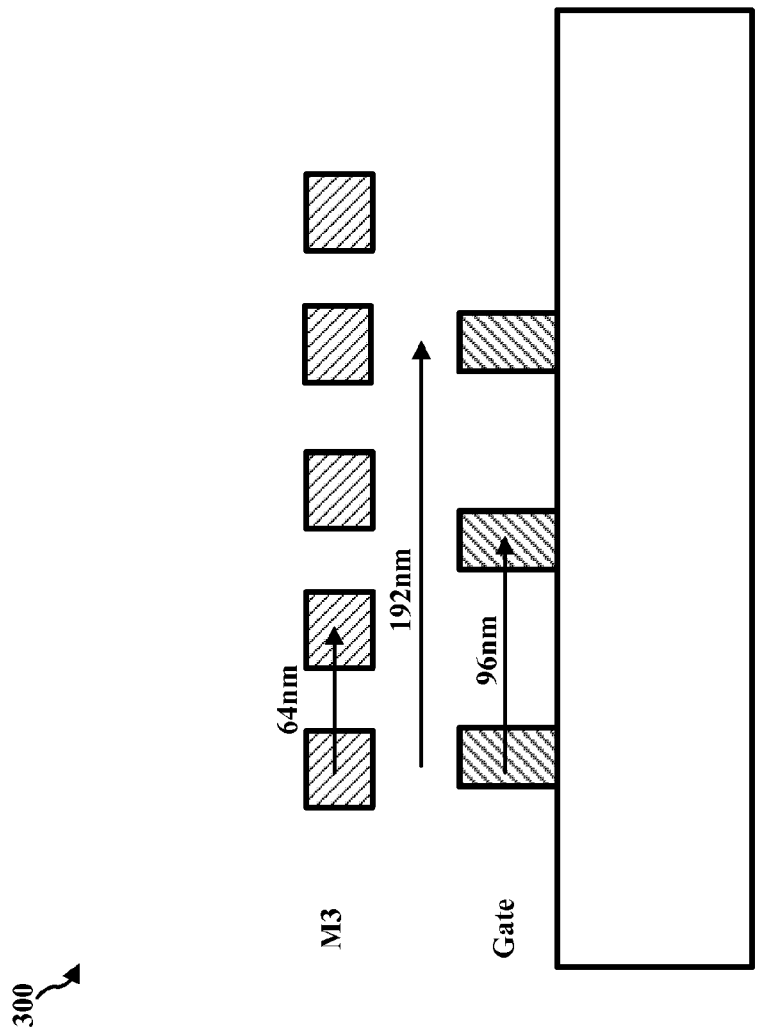

FIG. 3 is a diagram 300 illustrating a first set of exemplary gate interconnect, metal interconnect, and via pitches. As discussed supra, the scaling of the gate interconnect pitch $g_2$ and/or the metal layer M2 interconnect pitch $ma_2$ may be increased in order to satisfy the requisite scaling of the via pitch $v_2$. For example, as shown in FIG. 3, the scaling of the gate interconnect pitch $g_2$ is increased to 73.85%. When the gate interconnect pitch $g_2$ is a minimum 96 nm and the metal layer M2 pitch $ma_2$ is a minimum 64 nm, the via pitch $v_2$ is 115 nm, which satisfies the aforementioned 115 nm via pitch limit. As shown in FIG. 3, the metal layer M3 pitch may also be a minimum of 64 nm. The least common multiple (LCM) (also referred to as lowest common multiple) of 96 nm and 64 nm is 192 nm. In one configuration, the LCM of the minimum gate and metal interconnect pitches may be constrained to be less than 20 times the minimum gate interconnect pitch. For example, the LCM of the minimum gate and metal interconnect pitches may be constrained to be less than 1920 nm (20*96 nm). In this case, the minimum gate and metal interconnect pitches of 96 nm and 64 nm, respectively, satisfy such a requirement.

Figure 4:
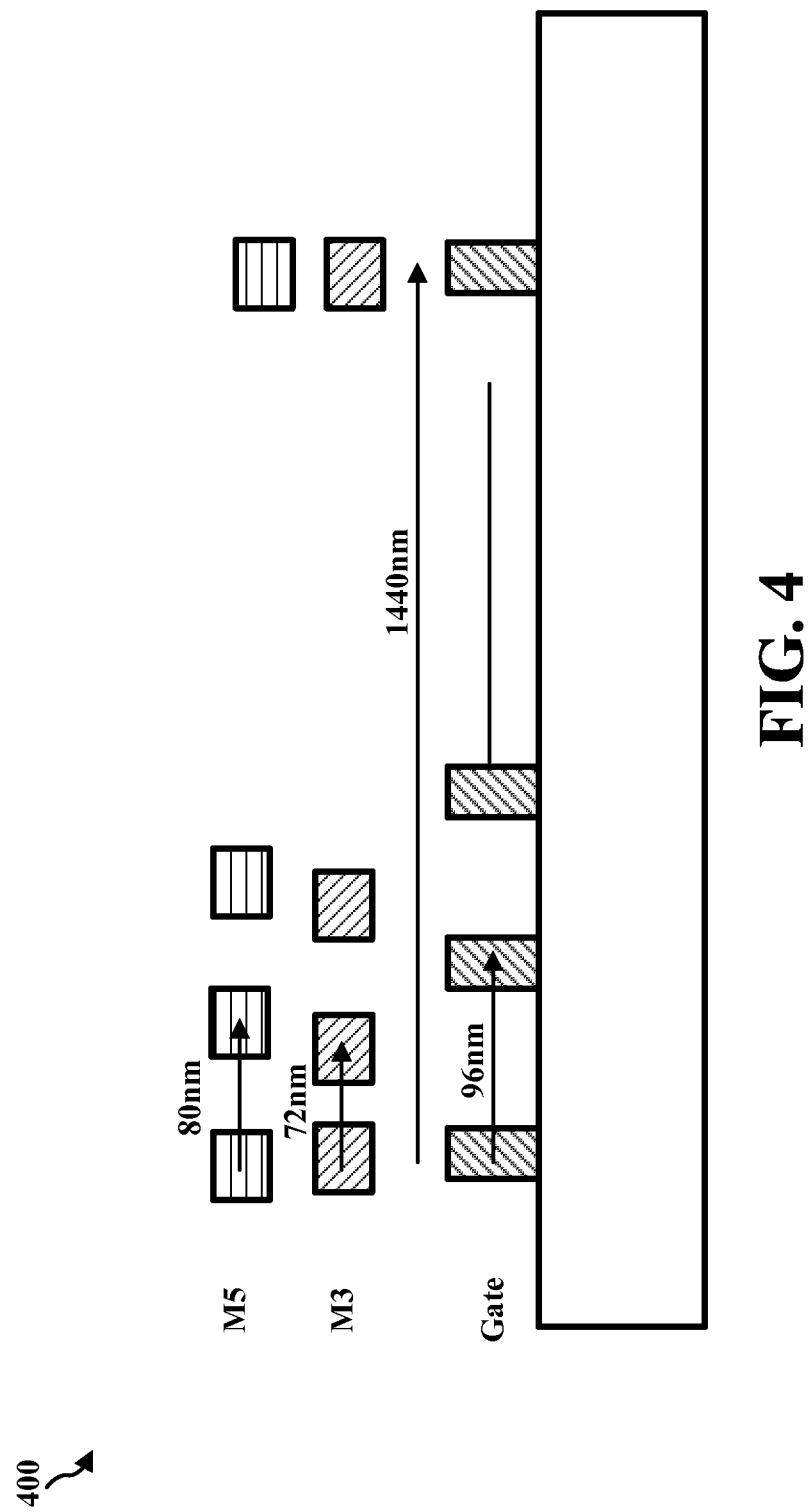
FIG. 4 is a diagram illustrating a second set of exemplary gate interconnect, metal interconnect, and via pitches.

FIG. 4 is a diagram 400 illustrating a second set of exemplary gate interconnect, metal interconnect, and via pitches. In this example, the minimum gate interconnect pitch may be 96 nm, the minimum metal layers M2 may be 64 nm, the minimum metal layer M3 pitch may be 72 nm, and the minimum metal layer M5 pitch may be 80 nm. The LCM of 96 nm, 72 nm, and 80 nm is 1440 nm.

In one configuration, an SOC apparatus may have a plurality of gate interconnects with a minimum pitch g, a plurality of metal interconnects with a minimum pitch m, and a plurality of vias interconnecting the gate interconnects and the metal interconnects. The vias have a minimum pitch v. The pitches g, m, and v are such that $g^2+m^2 \geq v^2$ and an LCM of g and m is less than 20 g. In one example, g is equal to or is approximately equal to 96 nm, m is equal to or is approximately equal to 64 nm, and v is equal to or is approximately equal to 115 nm. With pitches of g=96 nm and m=64 nm, the LCM is 192 nm, which is less than 1920 nm. The pitches g, m, and v are constrained by the equations $g^2+m^2 \geq v^2$ and LCM(g,m)<20 g. In one configuration, a via pitch v is assumed, and the gate interconnect pitch g and metal interconnect pitch m are adjusted to satisfy the equations. The plurality of metal interconnects are on at least one of a first interconnect level or a second interconnect level, and the vias interconnect the metal interconnects between the first interconnect level and the second interconnect level. The first interconnect level may be a first metal layer M1 and the second interconnect level may be a second metal layer M2.

The SOC apparatus may further include a second plurality of metal interconnects with a minimum pitch of $m_2$, where $m_2 > m$ and the LCM of g, m, and $m_2$ is less than 20 g. In one example, g is equal to or is approximately equal to 96 nm, m is equal to or is approximately equal to 72 nm, v is equal to or is approximately equal to 115 nm, and $m_2$ is equal to or is approximately equal to 80 nm. With pitches of g=96 nm, m=72 nm, and $m_2$=80 nm, the LCM is 1440 nm. The pitches g, m, $m_2$, and v are constrained by the equations $g_2+m^2 \geq v^2$ and LCM(g, m, $m_2$)<20 g. In one configuration, a via pitch v is assumed, and the gate interconnect pitch g, metal interconnect pitch m, and metal interconnect pitch $m_2$ are adjusted to satisfy the equations. The plurality of metal interconnects may be on a third interconnect level (e.g., metal layer M3) and the second plurality of metal interconnects may be on a fifth interconnect level (e.g., metal layer M5) higher than the third interconnect level. The vias interconnect metal interconnects between the plurality of metal interconnects and the second plurality of metal interconnects. The third interconnect level may be a third metal layer M3 and the fifth interconnect level may be a fifth metal layer M5.

Figure 5:
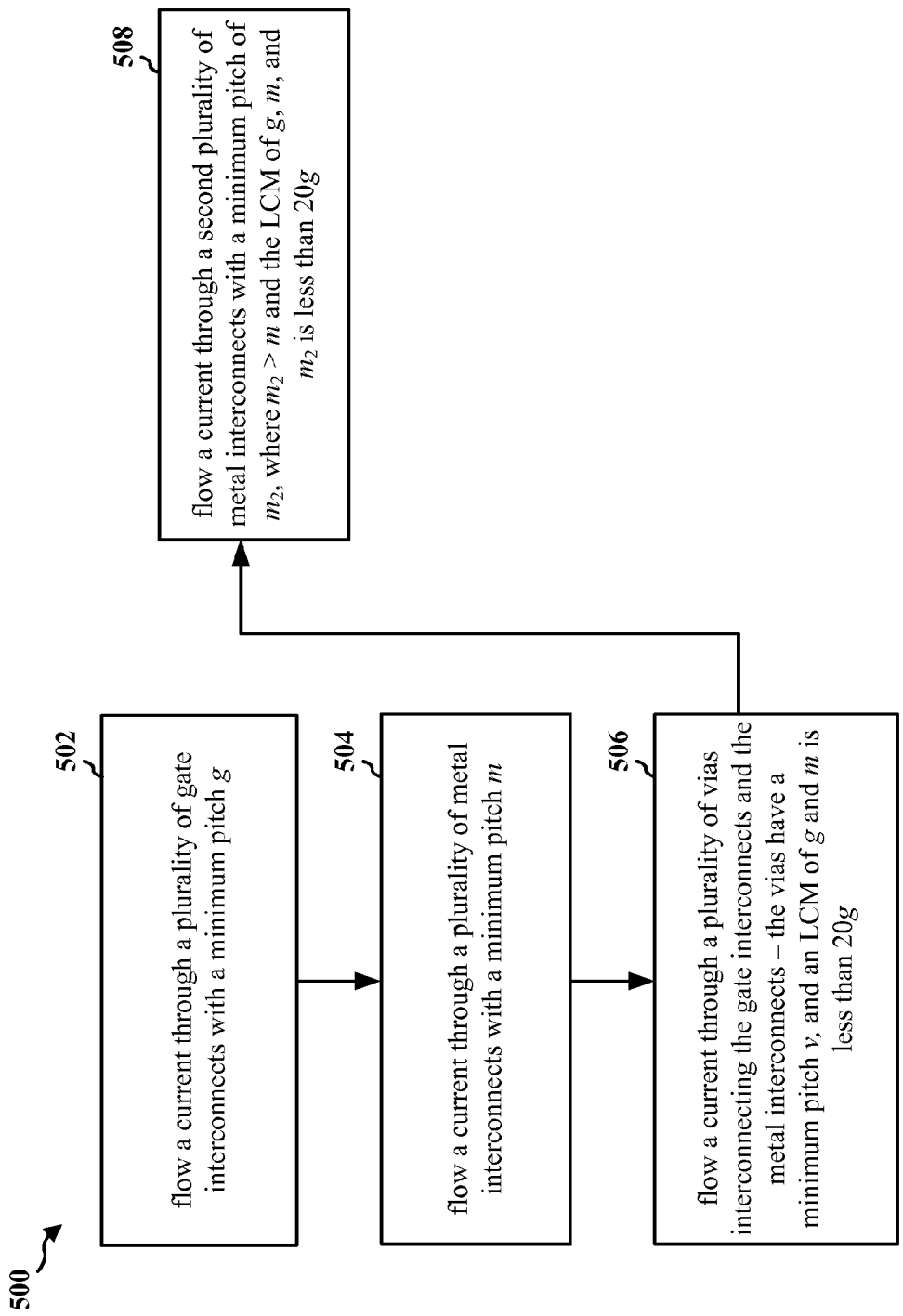
FIG. 5 is a flow chart of a method of operating an SOC apparatus.

FIG. 5 is a flow chart 500 of a method of operating an SOC apparatus. At step 502, a current is flowed through a plurality of gate interconnects with a minimum pitch g. At step 504, a current is flowed through a plurality of metal interconnects with a minimum pitch m. At step 506, a current is flowed through a plurality of vias interconnecting the gate interconnects and the metal interconnects. The vias have a minimum pitch v. The pitches of the gate interconnects, metal interconnects, and vias satisfy $g^2+m^2 \geq v^2$. In addition, an LCM of g and m is less than 20 g. The plurality of metal interconnects may be on at least one of a first interconnect level or a second interconnect level, and the vias may interconnect the metal interconnects between the first interconnect level and the second interconnect level. The first interconnect level may be a first metal layer and the second interconnect level may be a second metal layer. At step 508, a current is flowed through a second plurality of metal interconnects with a minimum pitch of $m_2$, where $m_2 > m$ and the LCM of g, m, and $m_2$ is less than 20 g. The plurality of metal interconnects may be on a third interconnect level and the second plurality of metal interconnects may be on a fifth interconnect level. The vias may interconnect metal interconnects between the plurality of metal interconnects and the second plurality of metal interconnects. The third interconnect level may be a third metal layer and the fifth interconnect level may be a fifth metal layer.

In one configuration, an SOC apparatus includes means for flowing a current through a plurality of gate interconnects with a minimum pitch g, means for flowing a current through a plurality of metal interconnects with a minimum pitch m, and means for flowing a current through a plurality of vias interconnecting the gate interconnects and the metal interconnects. The vias having a minimum pitch v, $g^2+m^2 \geq v^2$, and an LCM of g and m is less than 20 g. The means for flowing a current through a plurality of gate interconnects is the plurality of gate interconnects, the means for flowing a current through a plurality of metal interconnects is the plurality of metal interconnects, and the means for flowing a current through a plurality of vias is the plurality of vias. The SOC apparatus may further include means for flowing a current through a second plurality of metal interconnects with a minimum pitch of $m_2$, where $m_2 > m$ and the LCM of g, m, and $m_2$ is less than 20 g. The means for flowing a current through a second plurality of metal interconnects is the second plurality of metal interconnects.

As provided supra, given a requirement to obtain an $x^2$% area scaling, greater than x % pitch scaling may be used for some interconnects. The minimum pitch scaling may be determined based on minimum via pitch limits. Such a scaling may provide improved cost, power, and performance benefits over an x % pitch scaling for all interconnects.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A system on a chip (SOC) apparatus, comprising:
a plurality of gate interconnects with a minimum pitch g;
a plurality of metal interconnects with a minimum pitch m; and
a plurality of vias formed in a single patterning process for a manufacturing technology less than or equal to 20 nm and interconnecting the gate interconnects and the metal interconnects, the vias having a minimum pitch v,
wherein $g^2 + m^2 \geq v^2$, wherein the minimum pitch v is greater than the minimum pitch g and the minimum pitch m used in the apparatus and a least common multiplier (LCM) of g and m is less than 20 g, wherein the parameters g and m are in nm.

2. The apparatus of claim 1, wherein g is approximately 96 nm, m is approximately 64 nm, and v is approximately 115 nm.

3. The apparatus of claim 1, wherein the plurality of metal interconnects are on at least one of a first interconnect level or a second interconnect level, and the vias interconnect the metal interconnects between the first interconnect level and the second interconnect level.

4. The apparatus of claim 3, wherein the first interconnect level is a first metal layer and the second interconnect level is a second metal layer.

5. The apparatus of claim 1, further comprising a second plurality of metal interconnects with a minimum pitch of $m_2$, wherein $m_2 > m$ and the LCM of g, m, and $m_2$ is less than 20 g.

6. The apparatus of claim 5, wherein g is approximately 96 nm, m is approximately 72 nm, v is approximately 115 nm, and $m_2$ is approximately 80 nm.

7. The apparatus of claim 5, wherein the plurality of metal interconnects are on a third interconnect level and the second plurality of metal interconnects are on a fifth interconnect level, wherein the vias interconnect metal interconnects between the plurality of metal interconnects and the second plurality of metal interconnects.

8. The apparatus of claim 7, wherein the third interconnect level is a third metal layer and the fifth interconnect level is a fifth metal layer.

9. A system on a chip (SOC) apparatus, comprising:
a plurality of gate interconnect means with a minimum pitch g;
a plurality of metal interconnect means with a minimum pitch m; and
a plurality of interconnecting means formed in a single patterning process for a manufacturing technology less than or equal to 20 nm, the interconnecting means interconnecting the gate interconnect means and the metal interconnect means, the interconnecting means having a minimum pitch v,
wherein $g^2 + m^2 \geq v^2$, wherein the minimum pitch v is greater than the minimum pitch g and the minimum pitch m used in the apparatus and a least common multiplier (LCM) of g and m is less than 20 g, wherein the parameters g and m are in nm.

10. The apparatus of claim 9, wherein the plurality of metal interconnect means are on at least one of a first interconnect level or a second interconnect level, and the interconnecting means interconnect the metal interconnect means between the first interconnect level and the second interconnect level.

11. The apparatus of claim 10, wherein the first interconnect level is a first metal layer and the second interconnect level is a second metal layer.

12. The apparatus of claim 9, further comprising a second plurality of metal interconnect means with a minimum pitch of $m_2$, wherein $m_2 > m$ and the LCM of g, m, and $m_2$ is less than 20 g.

13. The apparatus of claim 12, wherein the plurality of metal interconnect means are on a third interconnect level and the second plurality of metal interconnect means are on a fifth interconnect level, wherein the interconnecting means interconnect metal interconnect means between the plurality of metal interconnect means and the second plurality of metal interconnect means.

14. The apparatus of claim 13, wherein the third interconnect level is a third metal layer and the fifth interconnect level is a fifth metal layer.

15. The apparatus of claim 1, wherein g and m are different.

\* \* \* \* \*